(12) United States Patent
Nishida

(10) Patent No.: US 9,236,285 B2
(45) Date of Patent: Jan. 12, 2016

(54) MOVABLE RANGE ADJUSTING MECHANISM FOR WORKPIECE CONVEYING DEVICE

(71) Applicant: EBARA CORPORATION, Tokyo (JP)

(72) Inventor: Hiroaki Nishida, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 23 days.

(21) Appl. No.: 13/901,255

(22) Filed: May 23, 2013

(65) Prior Publication Data

US 2013/0319820 A1    Dec. 5, 2013

(30) Foreign Application Priority Data

May 29, 2012 (JP) .................................. 2012/121515

(51) Int. Cl.
| | |
|---|---|
| *H01L 21/67* | (2006.01) |
| *H01L 21/687* | (2006.01) |
| *H01L 21/677* | (2006.01) |

(52) U.S. Cl.
CPC .... *H01L 21/68707* (2013.01); *H01L 21/67742* (2013.01)

(58) Field of Classification Search
CPC ................... H01L 21/68707; H01L 21/67742
USPC .................................. 414/226.01; 198/470.1
See application file for complete search history.

(56) References Cited

U.S. PATENT DOCUMENTS 4,944,650 A * 7/1990 Matsumoto ............. H01L 21/68
294/103.1
5,052,884 A * 10/1991 Igari .................. H01L 21/68707
414/744.2

(Continued)

FOREIGN PATENT DOCUMENTS

| JP | H06-031676 A | 2/1994 |
|---|---|---|
| JP | H11-227942 A | 8/1999 |

(Continued)

*Primary Examiner* — Gene Crawford
*Assistant Examiner* — Thomas Randazzo
(74) *Attorney, Agent, or Firm* — Pearne & Gordon LLP

(57) ABSTRACT

The present invention enables adjustment of a motion range of a workpiece conveying mechanism by a simple configuration. Provided is a workpiece conveying device including a simple motion range adjusting mechanism for conveying workpieces of different sizes. According to one embodiment of the invention, the workpiece conveying device for conveying workpieces includes a workpiece holding mechanism configured to operate to hold and release the workpiece. The workpiece conveying device also includes an actuator equipped with a movable member directly or indirectly connected to the workpiece holding mechanism to drive the workpiece holding mechanism. The workpiece conveying device further includes a stopper device having a male member and a female member, and these male member and female member are configured to engage with each other in at least two different arrangements, thereby defining at least two predefined discontinuous holding positions of the workpiece holding mechanism connected to the movable member.

20 Claims, 9 Drawing Sheets

(56) References Cited

U.S. PATENT DOCUMENTS

| | | | | |
|---|---|---|---|---|
| 5,328,317 | A * | 7/1994 | Masui | H05K 13/0434 198/345.1 |
| 7,029,224 | B2 * | 4/2006 | Kubo | B25J 15/103 414/680 |
| 7,208,938 | B2 * | 4/2007 | Song | G01R 1/04 198/345.3 |
| 7,360,985 | B2 * | 4/2008 | Okabe | H01L 21/67772 414/217 |
| 7,611,182 | B2 * | 11/2009 | Kim | H01L 21/68707 294/103.1 |
| 2009/0067959 | A1 * | 3/2009 | Takahashi | B24B 37/345 414/226.01 |
| 2009/0269933 | A1 * | 10/2009 | Yamaguchi | C23C 16/4584 438/706 |
| 2012/0193506 | A1 * | 8/2012 | Takahashi | B24B 37/345 248/647 |

FOREIGN PATENT DOCUMENTS

| | | |
|---|---|---|
| JP | H11-347978 A | 12/1999 |
| JP | 2001-300879 A | 10/2001 |
| JP | 2003-309089 A | 10/2003 |
| JP | 2006-272526 A | 10/2006 |
| JP | 2009-154253 A | 7/2009 |
| WO | 2007-099976 A1 | 9/2007 |

* cited by examiner (a)

(b)

(a)　　　　　(b)　　　　　(c)

(a)

(b)

(a)

(b)

(a)

(b)

(c)

MOVABLE RANGE ADJUSTING MECHANISM FOR WORKPIECE CONVEYING DEVICE

BACKGROUND OF THE INVENTION

1. Field of the Invention

The present invention relates to a movable range adjusting mechanism for a workpiece conveying device.

2. Technical Field of the Invention

In a manufacturing process of a semiconductor device, a device which conveys workpieces such as semiconductor wafers is commonly used (e.g., Japanese Patent Laid-Open No. 2006-272526 and Japanese Patent Laid-Open No. 2001-300879). For example, there is a workpiece conveying device which holds a semiconductor wafer by a pair of arms driven to open and close by an actuator equipped with a cylinder, and moves the semiconductor wafer to a desired position (e.g., Japanese Patent Laid-Open No. 2003-309089). In the manufacturing of a semiconductor device, it may be necessary to convey semiconductor wafers of different sizes in some cases.

Since a conveying mechanism for semiconductor wafers is designed and adjusted according to the size of the wafer to be processed, wafers of different sizes may not be properly conveyed. For example, when the size of the semiconductor wafer is smaller than the size to which the conveying mechanism is adjusted, the holding force becomes smaller and clearance becomes too large at positions where the wafer is held, which may lead to deterioration of positioning accuracy of the wafer. On the other hand, when the size of the semiconductor wafer is larger than the size to which the conveying mechanism is adjusted, the holding force becomes too large, which may cause excessive stress on the wafer or prevent the wafer from being properly held.

In some holding mechanisms such as the arm of the conveying mechanism, a motion range thereof may be changed according to the size of the workpiece, such as the semiconductor wafer, to be conveyed. When controlling the motion range of the holding mechanism of the conveying mechanism by a motor-based actuator, the motion range can be changed by changing motion parameters of the motor (e.g., a pulse number, etc. in the case of a pulse motor). However, such a motor-based actuator tends to be costly. Motion mechanisms using a pneumatic or hydraulic actuator such as a cylinder mechanism are generally less costly than a motor-based actuator. When changing the motion range of such a cylinder-based actuator, the motion range is changed by adjusting a position of a stopper which defines the motion range. For example, the position of the stopper can be adjusted by a screw. However, when adjusting the stopper position by the screw, the stopper position may be slightly different after each adjustment operation, and repeatability and accuracy of the positioning may not be adequate. In addition, it tends to take time to adjust the stopper position when the screw is used to adjust the stopper position.

SUMMARY OF THE INVENTION

According to one embodiment of the present invention, there is provided a workpiece conveying device equipped with a simple motion range adjusting mechanism for conveying workpieces of different sizes. According to one embodiment of the present invention, the workpiece conveying device for conveying workpieces includes a workpiece holding mechanism configured to operate so as to hold or release the workpiece. This workpiece conveying device also includes an actuator equipped with a movable member directly or indirectly connected to the workpiece holding mechanism in order to drive the workpiece holding mechanism. The workpiece conveying device further includes a stopper device having a male member and a female member, and these male member and female member are configured to engage with each other in at least two different arrangements, thereby defining at least two predefined discontinuous holding positions of the workpiece holding mechanism connected to the movable member.

According to one embodiment of the present invention, there is provided a stopper device which defines at least two predefined discontinuous holding positions of the workpiece holding mechanism. This stopper device includes a male member and a female member, and these male member and female member are configured to engage with each other in at least two different arrangements, thereby defining at least two predefined discontinuous holding positions of the workpiece holding mechanism.

According to one embodiment of the present invention, there is provided a method for adjusting the holding position of the workpiece holding mechanism by means of the stopper device of the present invention. This method includes steps of loosening a nut, changing a relative engagement position of the male member and the female member, and fastening the nut to fix the male member and the female member at the changed engagement position.

DETAILED DESCRIPTION OF THE INVENTION

Figure 1:
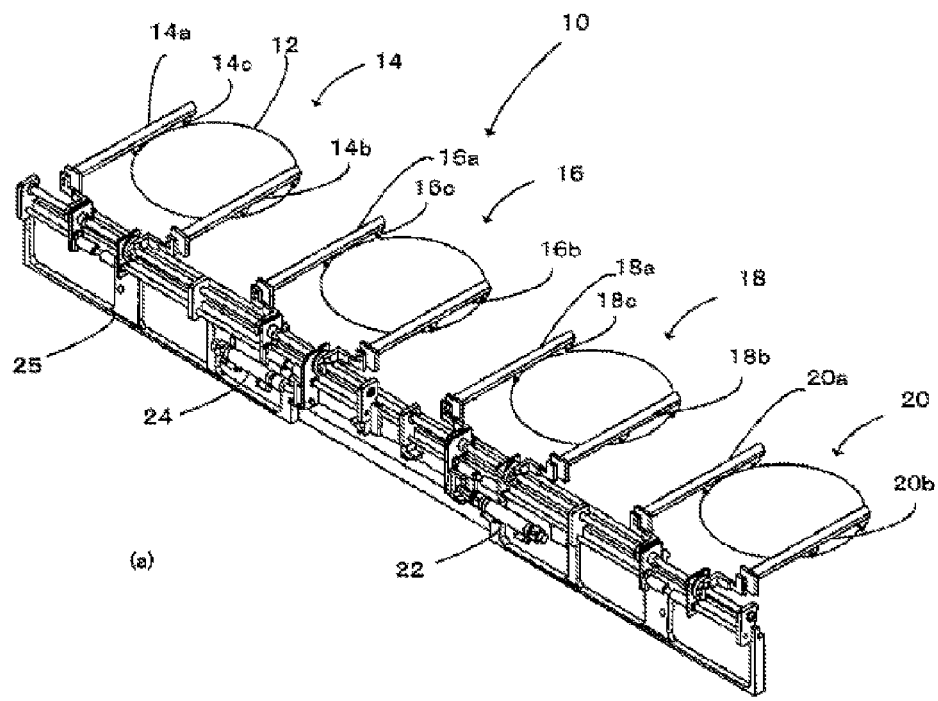
FIG. 1(A) is a perspective view showing a part of a conveying mechanism of a workpiece conveying device according to one embodiment of the present invention.
FIG. 1(B) is a perspective view showing a pair of arms of the conveying mechanism.
Figure 1:
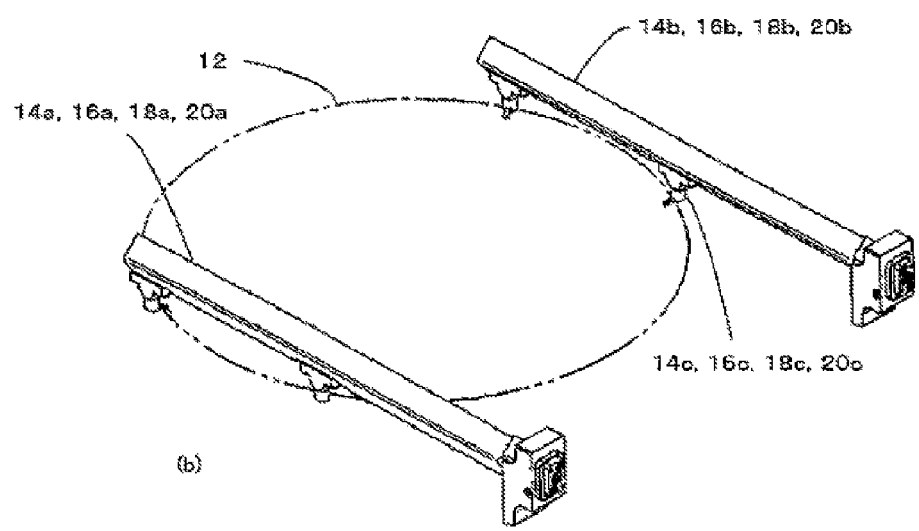

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Hereinbelow, embodiments of the present invention will be described with the accompanying drawings.

Figure 12:
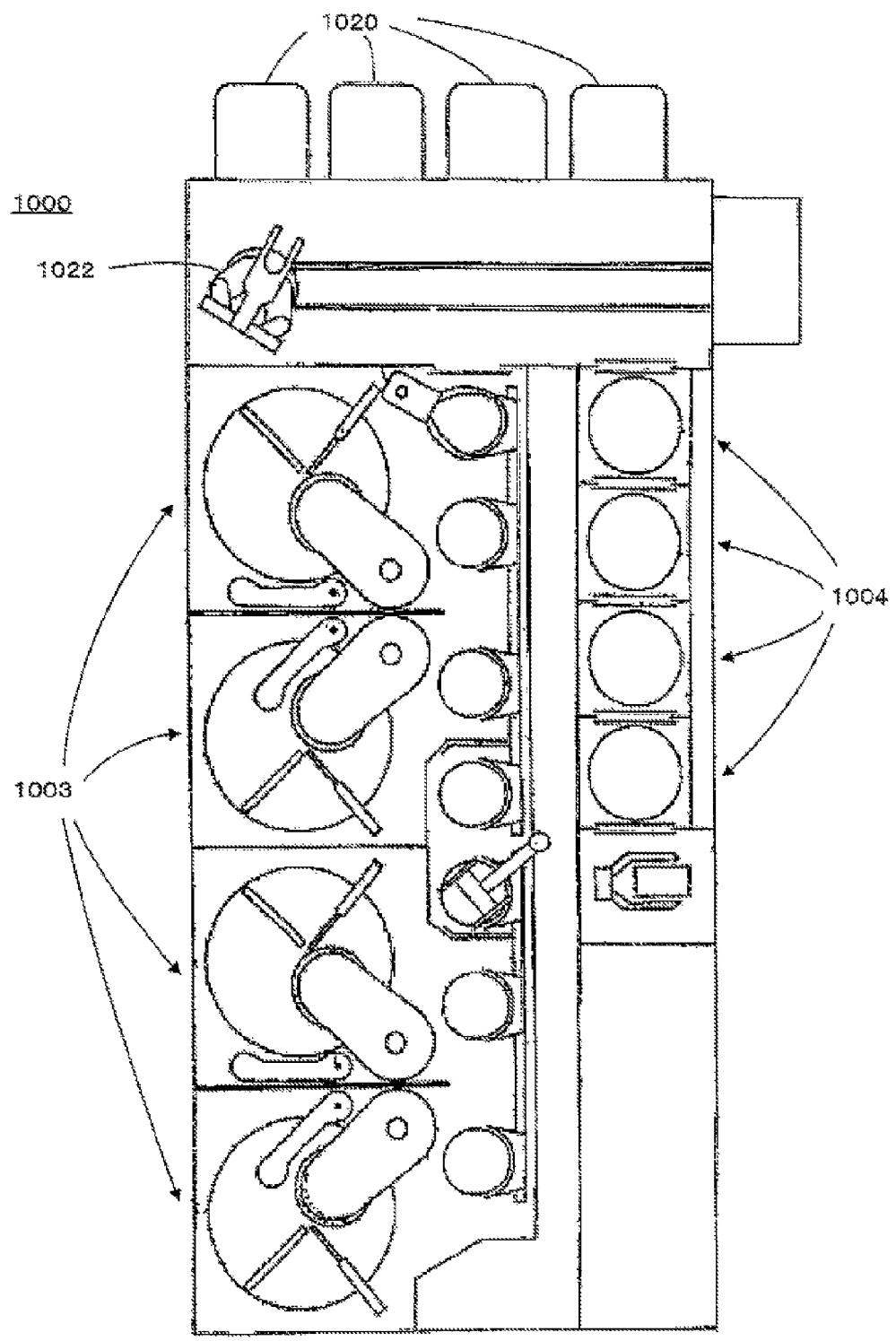
FIG. 12 is an outline view showing an example of a semiconductor polishing device.

FIG. 1(a) is a perspective view showing a conveying mechanism 10 of a workpiece conveying device according to one embodiment of the present invention. FIG. 1(b) is an enlarged perspective view of a pair of arms of the conveying mechanism 10 in FIG. 1(a). The conveying mechanism 10 is illustrated as a device for conveying a semiconductor wafer 12 as a workpiece. The conveying mechanism 10 in FIG. 1 can also be used, for example, as a conveying mechanism used in a cleaning machine 1004 of a semiconductor wafer polishing device 1000 shown in FIG. 12. In the semiconductor wafer polishing device 1000, the semiconductor wafers are conveyed from a front loading part 1020, where the semiconductor wafers are stored, to a polishing part 1003 by a robot 1022, polished in the polishing part 1003, and moved to the cleaning machine 1004 by various kinds of semiconductor wafer conveying mechanisms. As for the entire semiconductor wafer polishing device 1000, for example, that disclosed in International Publication No. WO 2007/099976 Pamphlet can be used.

As an example, the conveying mechanism 10 according to one embodiment of the present invention shown in FIG. 1 is a conveying mechanism used inside the semiconductor wafer cleaning machine. The conveying mechanism 10 is equipped with four chucking units 14, 16, 18, and 20 as a holding mechanism for detachably holding the wafer 12. These chucking units 14, 16, 18, and 20 are equipped with pairs of arms 14a, 14b; 16a, 16b; 18a, 18b; and 20a, 20b, respectively. In the illustrated embodiment, the arms are respectively provided with two chuck pieces 14c, 16c, 18c, and 20c. Thus, four chuck pieces are provided in one chucking unit. In the illustrated embodiment, as will be described in detail below, the pair of arms is opened and closed by air cylinders 22 and 24 so as to hold and release the wafer 12 by the four chuck pieces provided on the arm. The air cylinders 22 and 24 are fixed to the main frame 25.

Figure 2:
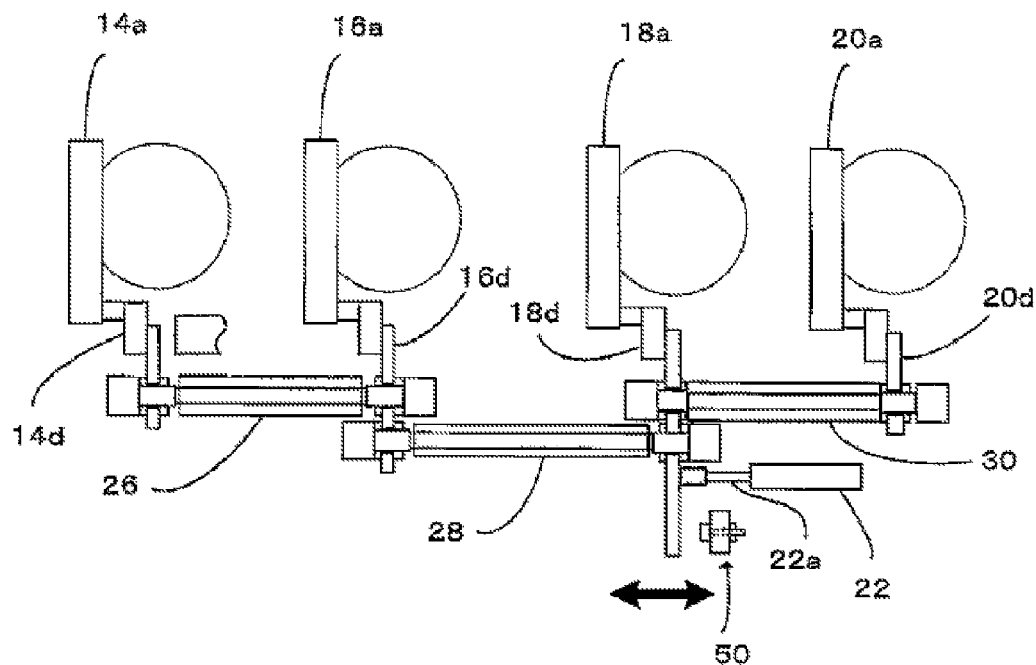
FIG. 2 is a schematic view illustrating motion of a driving arm which is a workpiece holding mechanism of the conveying mechanism shown in FIG. 1.

FIG. 2 is a schematic view illustrating a driving mechanism of the arms 14a, 16a, 18a, and 20a. For the sake of illustration and clarity of description, the arms 14b, 16b, 18b, and 20b are shown in a simplified manner. In addition, FIG. 2 is a simplified illustration of the driving mechanism shown in FIG. 1. As shown in FIG. 2, the arms 14a to 20a are connected to connecting members 14d to 20d. As illustrated, the connecting members 14d and 16d are connected to a rigid rod 26, the connecting members 16d and 18d are connected to a rigid rod 28, and the connecting members 18d and 20d are connected to a rigid rod 30. The connecting members 14d, 16d, 18d, and 20d may each be a structure made of a single member, or each connecting member 14d, 16d, 18d, and 20d may be constituted by connecting a plurality of members. In the embodiment shown in FIG. 2, the connecting members 14d and 20d are shorter than the other connecting members, the connecting member 16d is longer than these two connecting members 14d and 20d, and the connecting member 18d is the longest.

The connecting member 18d of the arm 18a is driven by the air cylinder 22. One end of a shaft 22a constituting a movable member is connected to the air cylinder 22. The other end of the shaft 22a is connected to the connecting member 18d of the arm 18a. The shaft 22a is driven by air pressure inside the air cylinder 22. By the shaft 22a being driven by the air cylinder 22, the arm 18a is driven together with the connecting member 18d. When the connecting member 18d is driven by the rigid rods 26, 28, and 30, the other connecting members 14d, 16d, and 20d are also interlockingly driven. This means that the four arms 14a to 20a are simultaneously driven by one actuator constituted of the air cylinder 22 and the shaft 22a. Note that, as another embodiment, each arm may be provided with one actuator such as an air cylinder so as to be separately driven. Or, the arms 14b, 16b, 18b, and 20b may be configured to be directly connected to the air cylinder 22 being the actuator without interposition of the connecting members 14d, 16d, 18d, and 20d as in the illustrated embodiment.

A movable range of the arm 18a at least on one side is defined by a stopper device 50. As shown in FIG. 2, the movable range of the connecting member 18d, that is, the arm 18a is limited by contact of the connecting member 18d with the stopper device 50.

Figure 3:
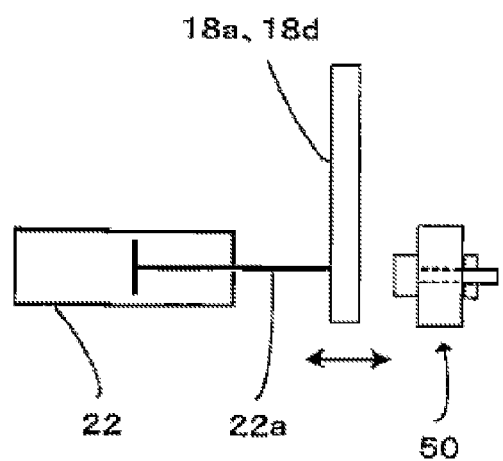
FIG. 3 is a view showing a stopper device and an actuator for driving the workpiece holding mechanism according to one embodiment of the present invention.

FIGS. 3 to 8 are views for describing a detailed structure of the stopper device 50. FIG. 3 shows an arrangement of the cylinder 22, the shaft 22a, the connecting member 18d, and the stopper device 50 in a simplified manner. The stopper device 50 is fixed to the main frame 25 (not shown in FIG. 3). The shaft 22a is driven by air pressure inside the air cylinder 22, so that the connecting member 18d and the arm 18a connected to the connecting member 18d are driven. Note that, for simplification, only a part of the connecting member 18d is shown in FIG. 3.

The stopper device 50 includes a male member 100 and a female member 200. As will be described in detail below, the male member 100 and the female member 200 can engage with each other in two different arrangements, thereby defining two predefined discontinuous stopping positions of the connecting member 18d and the arm 18a.

Figure 4:
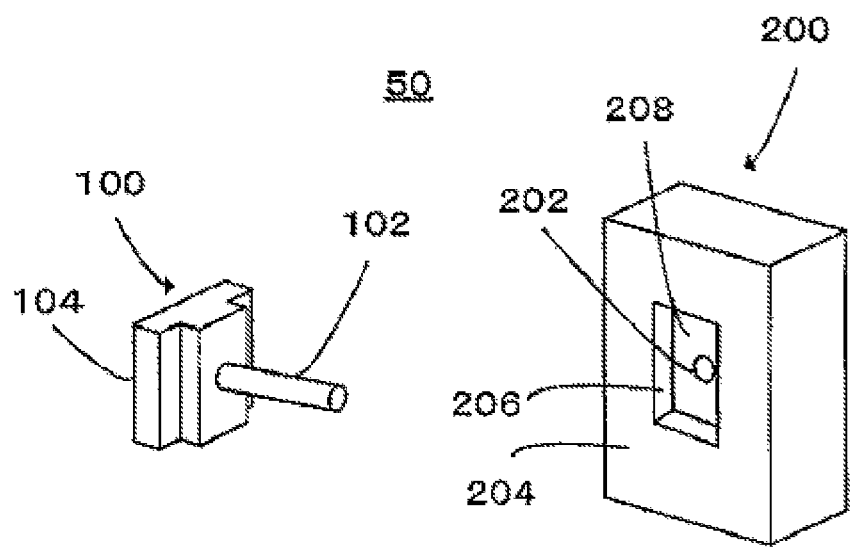
FIG. 4 is a perspective view showing the stopper device according to one embodiment of the present invention in a state where a male member and a female member are separated.

FIG. 4 is a perspective view showing a state where the male member 100 and the female member 200 are separated. As shown in FIG. 4, the male member 100 is equipped with a screw part 102, and the screw part extends from a head part 104 of the male member 100.

Figure 5:
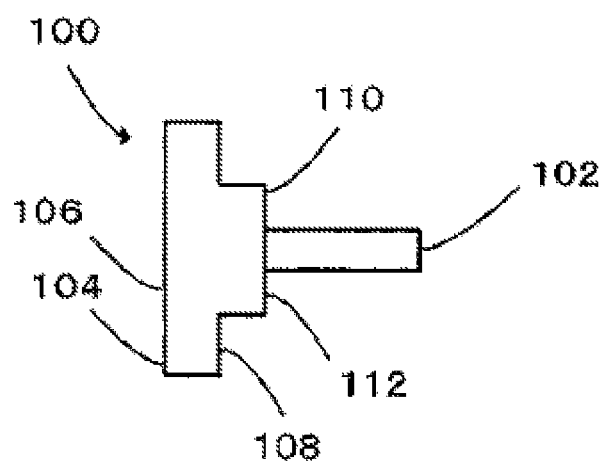
FIG. 5 is a side view of the male member of the stopper device according to one embodiment of the present invention.

FIG. 5 is a side view of the male member. As shown in FIG. 5, the head part 104 of the male member 100 has a stopper surface 106. The stopper surface 106 makes contact with the connecting member 18d of the arm 18a, thereby limiting the movable range of the arm 18a. The head part 104 of the male member 100 has a first surface 108 on a side opposite to the stopper surface 106. The head part 104 of the male member 100 also has a protruding part 110 protruding from the first surface 108. The protruding part 110 defines a second surface 112 having a height from the stopper surface 106 different from that of the first surface 108.

The female member 200 is provided with a hole 202 through which the screw part 102 of the male member 100 passes. The female member 200 has a first surface 204 on a side toward the male member 100. The female member 200 also has a recessed part 206 recessed from the first surface 204. The recessed part 206 defines a second surface 208 at a bottom surface thereof. The hole 202 extends from the second surface 208.

Figure 6:
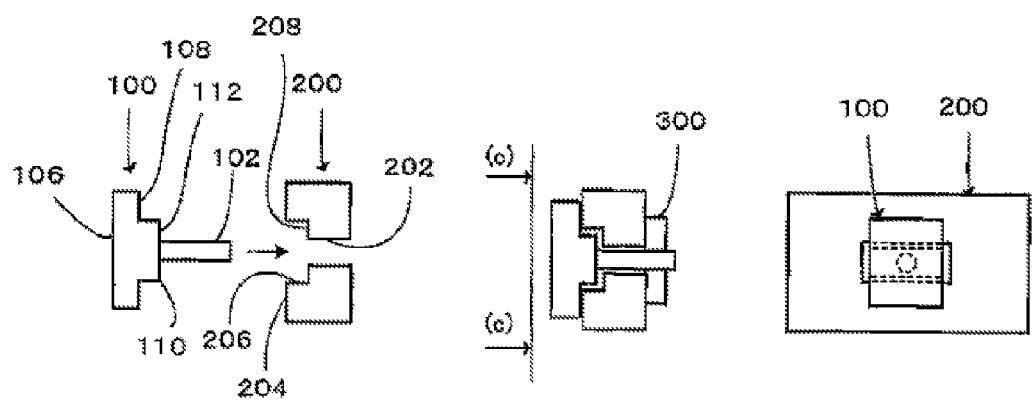
FIG. 6 is a view showing engagement in a first arrangement of the male member and the female member of the stopper device according to one embodiment of the present invention.

The male member 100 and the female member 200 illustrated can engage with each other in two different arrangements. As a first arrangement, as shown in FIG. 6, the male member 100 can be engaged in a state where the protruding part 110 of the male member 100 is inserted in the recessed part 206 of the female member 200, that is, engaged so that the first surface 108 of the male member 100 makes contact with the first surface 204 of the female member 200. FIG. 6(a) is a cross-sectional view showing a state where the male member 100 and the female member 200 are separated; FIG. 6(b) is a cross-sectional view showing a state where the male member 100 and the female member 200 are engaged with each other in the first arrangement; and FIG. 6(c) is a plan view showing a state, where the male member 100 and the female member 200 are engaged with each other in the first arrangement, viewed from a direction indicated by arrows in FIG. 6(b). As shown in FIG. 6(b), engaging a nut 300 with the screw part 102 of the male member 100 can fix the male member 100 and the female member 200 in the first arrangement. It is preferable that a clearance is formed between the second surface 112 of the male member 100 and the second surface 208 of the female member 200 in the first arrangement. That is, it is preferable that the protruding part 110 of the male member 100 is formed to have a height smaller than the depth of the recessed part 206 of the female member 200. This is to ensure that the first surface 108 of the male member 100 makes contact with the first surface 204 of the female member 200 without being interrupted by the contact of the second surface 112 of the male member 100 with the second surface 208 of the female member 200.

Figure 7:
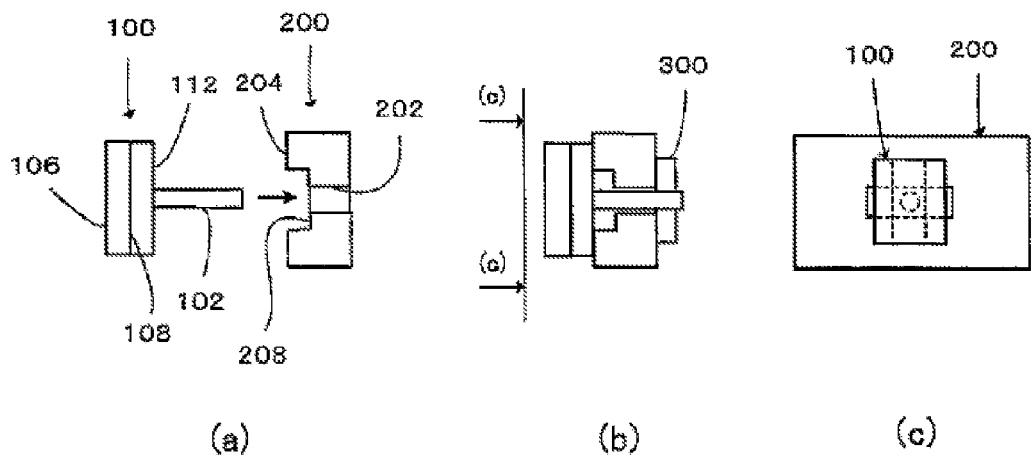
FIG. 7 is a view showing engagement in a second arrangement of the male member and the female member of the stopper device according to one embodiment of the present invention.

As the second arrangement, as shown in FIG. 7, the male member 100 can be engaged in a state where the protruding part 110 of the male member 100 is not inserted in the female member 200, that is, engaged so that the second surface 112 of the male member 100 makes contact with the first surface 204 of the female member 200. More specifically, in the illustrated embodiment, the male member 100 is turned 90° around the screw part 102 from the state shown in FIG. 6 to engage with the female member 200. FIG. 7(a) is a cross-sectional view showing a state where the male member 100 and the female member 200 are separated; FIG. 7(b) is a cross-sectional view showing a state where the male member 100 and the female member 200 are engaged with each other in the second arrangement; and FIG. 7(c) is a plan view showing a state, where the male member 100 and the female member 200 are engaged with each other in the second arrangement, viewed from a direction indicated by arrows in FIG. 7(b). As shown in FIG. 7(b), engaging the nut 300 with the screw part 102 of the male member 100 can fix the male member 100 and the female member 200 in the second arrangement.

Figure 8:
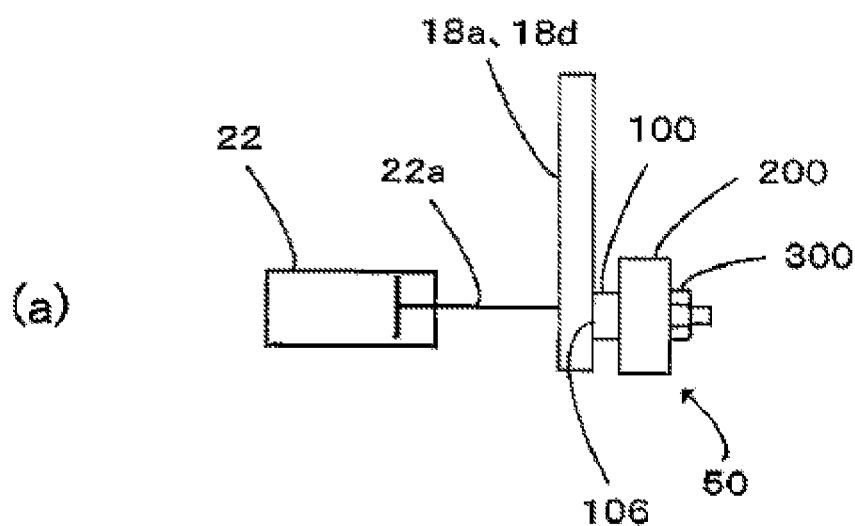
FIG. 8 is a view showing a change of a stopping position of the actuator by the arrangement of the male member and the female member of the stopper device according to one embodiment of the present invention.
Figure 8:
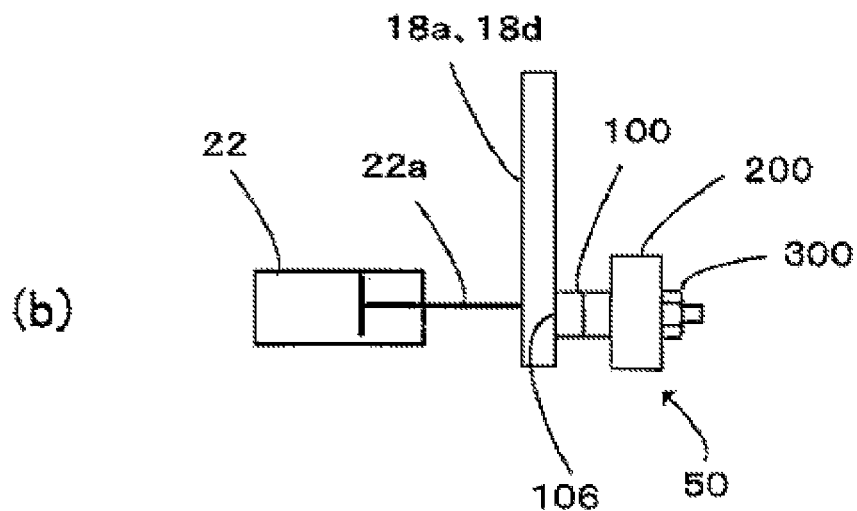

FIG. 8 is a side view showing states where the male member 100 and the female member are engaged with each other in each of the first arrangement (a) and the second arrangement (b). As shown in FIG. 8, by changing the arrangement of the male member 100 and the female member, the movable range of the arm 18a can be changed by the height of the protruding part 110 of the male member 100. It is thus possible to hold the wafers 12 of different sizes with the same arm by making the height of the protruding part 110 of the male member 100 correspond to the movable range to be adjusted to. In the case of the illustrated embodiment, a specific method for changing the movable range of the arm is: loosening the nut 300, turning the male member 100 about 90°, and fixing the male member 100 to the female member 200 again by the nut 300. The movable range of the arm can be thus very easily changed. For example, in a mechanism which allows the movable range of the arm to be continuously changed according to an insertion position of the screw, an error can occur each time the movable range is adjusted. On the other hand, in the present embodiment, as the adjustment accuracy of the movable range of the arm depends on the machining accuracy of the male member 100 and the female member 200, errors are unlikely to occur during the stage of adjusting the movable range of the arm.

While the configuration for adjusting the driving range of the arms 14a to 20a has been described in the above embodiment, the same configuration can also be adopted to change the driving range of the arms 14b to 20b.

Figure 9:
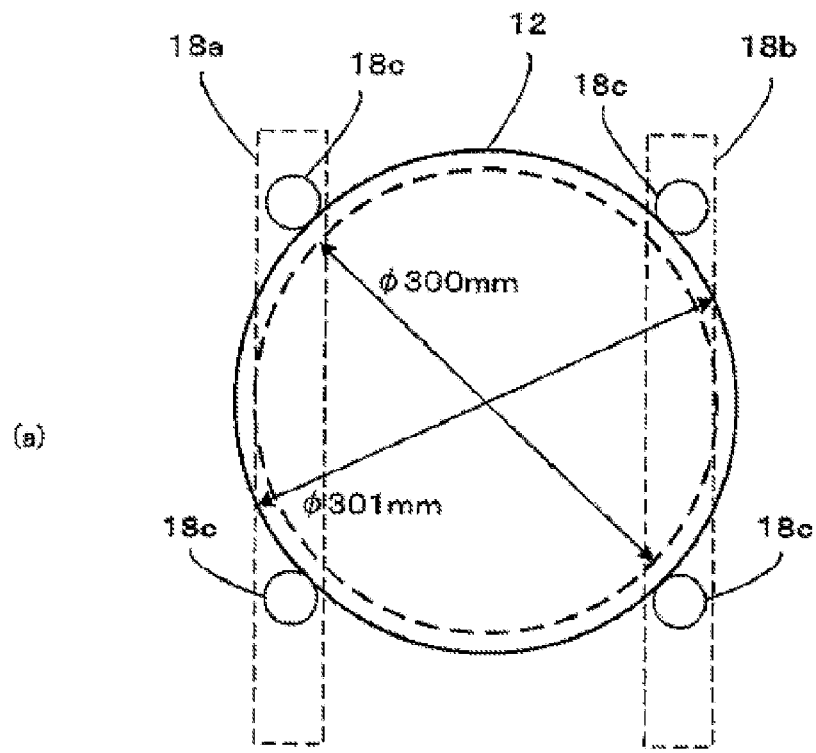
FIG. 9 is a view showing an embodiment for holding semiconductor wafers of different sizes.
Figure 9:
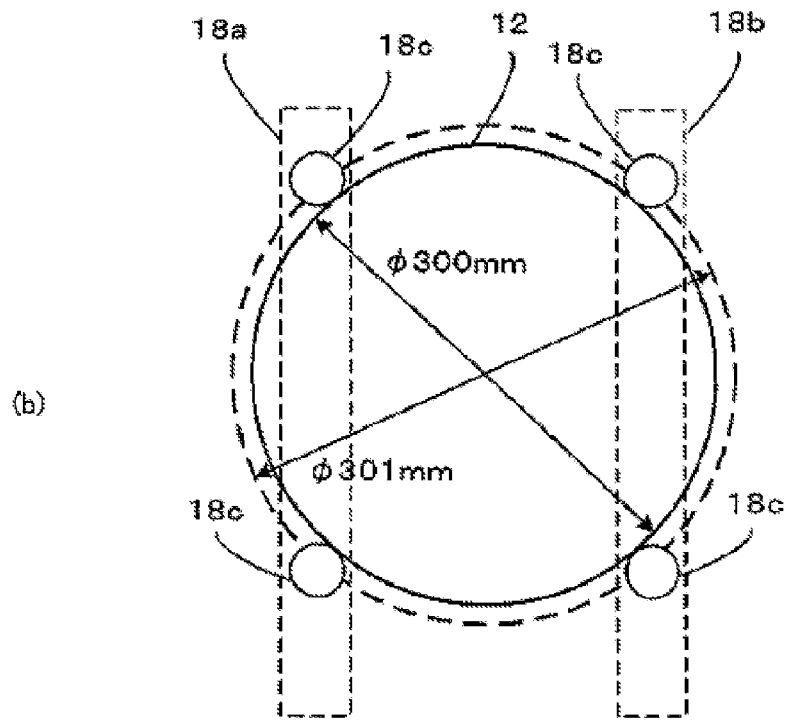

As one example, an embodiment for a semiconductor wafer with a diameter of 300 mm and a semiconductor wafer with a diameter of 301 mm will be described below. As shown in FIG. 9, to properly hold the wafers of different dimensions by the arm, the stopping position of the arm needs to be adjusted to a position suitable for the dimension of each wafer. If the stopping position of the arm is not properly adjusted, problems such as mentioned above can occur. FIG. 9(a) shows the wafer 12 with a diameter of 301 mm by a solid line, and for reference, the wafer with a diameter of 300 mm by a broken line. In FIG. 9(a), the wafer 12 with a diameter of 301 mm is held by the four chuck pieces 18c of the arm 18a. FIG. 9(b) shows the wafer with a diameter of 300 mm by a solid line, and for reference, the wafer with a diameter of 301 mm by a broken line. In FIG. 9(b), the wafer 12 with a diameter of 300 mm is held by the four chuck pieces 18c of the arm 18a. When the arms and the chuck pieces are arranged as illustrated, the stopping position of the arm should be changed by about 0.56 mm between the wafer with a diameter of 300 mm and the wafer with a diameter of 301 mm. Of course, this changing range varies depending on mounting positions of the chuck pieces of the arm. In this case, the stopping position of the arm can be adjusted by setting the height of the protruding part 110 of the male member 100 to 0.56 mm. It is preferable that the machining accuracy of the height of the protruding part 110, that is, the adjustment accuracy of the stopping position of the arm is approximately 0.01 mm.

The present invention can also be achieved in various forms other than the above embodiments.

While the side in contact with the connecting member 18d of the arm 18a has been taken as the male member in the above embodiment, as another embodiment, the positions of the male member and the female member can be reversed from those illustrated so that the side in contact with the connecting member is taken as the female member equipped with the screw part and the male member is fixed to the main frame.

As yet another embodiment, the stopper device constituted of the male member and the female member may be mounted to the connecting member of the arm so that the movable range of the arm is adjusted by contact of the stopper surface of the stopper device, which is driven together with the connecting member, with another member fixed to the main frame. Also in this case, the movable range of the arm can be adjusted as with the embodiments described along with FIGS. 2 to 8.

Figure 10:
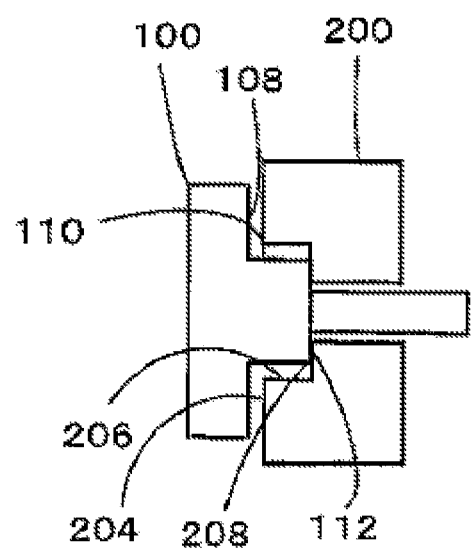
FIG. 10 is a view showing the male member and the female member according to one embodiment of the present invention.

While in the embodiments of FIGS. 2 to 8 the movable range of the arm is adjusted by the height of the protruding part 110 of the male member 100, as still yet another embodiment, a configuration can be adopted such that the movable range of the arm is adjusted by the depth of the recessed part of the female member. For example, as shown in FIG. 10, the protruding part 110 of the male member 100 can be formed to have a height larger than the depth of the recessed part 206 of the female member 200. In this case, the second surface 112 of the male member 100 makes contact with the second surface 208 of the female member 200 in the first arrangement shown in FIG. 10. The second arrangement is the same as that shown in FIG. 7. Thus, the stopping position of the connecting member, that is, the movable range of the arm can be adjusted by the depth of the recessed part 206 of the female member 200.

While the driving mechanism of the arm has been described as the actuator constituted of the air cylinder and the shaft in the above embodiments, a cylinder mechanism using other fluids or a different type of actuator may be used. For example, a hydraulic actuator, a rotary actuator, and the like can be used.

Figure 11:
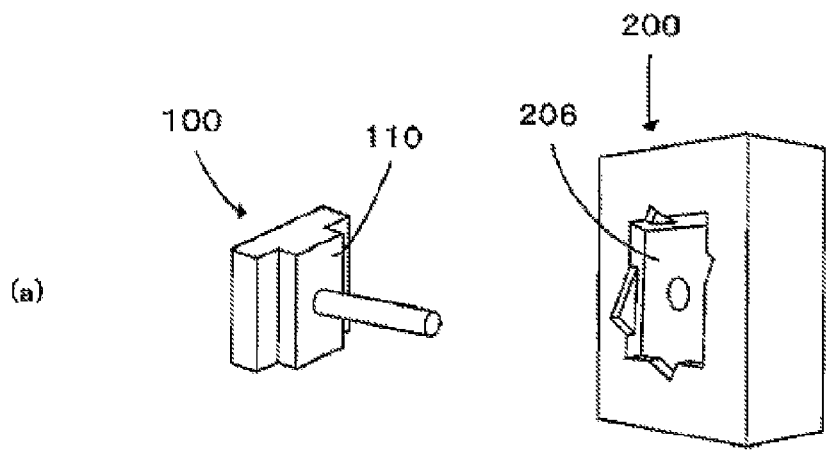
FIG. 11 is a view showing the male members and the female members according to one embodiment of the present invention.
Figure 11:
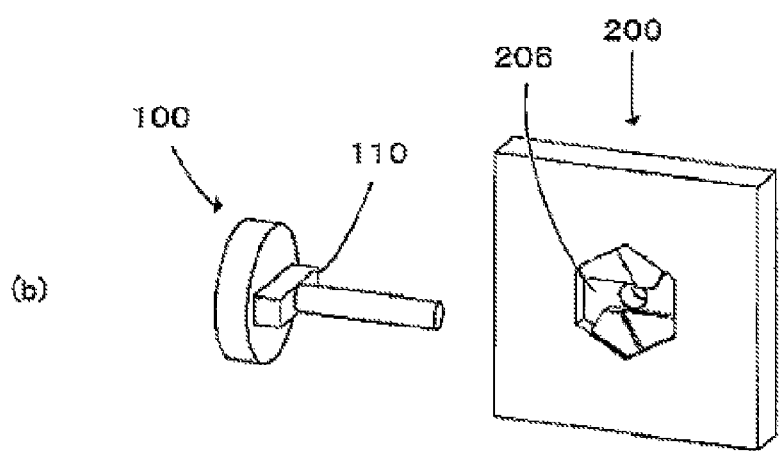
Figure 11:
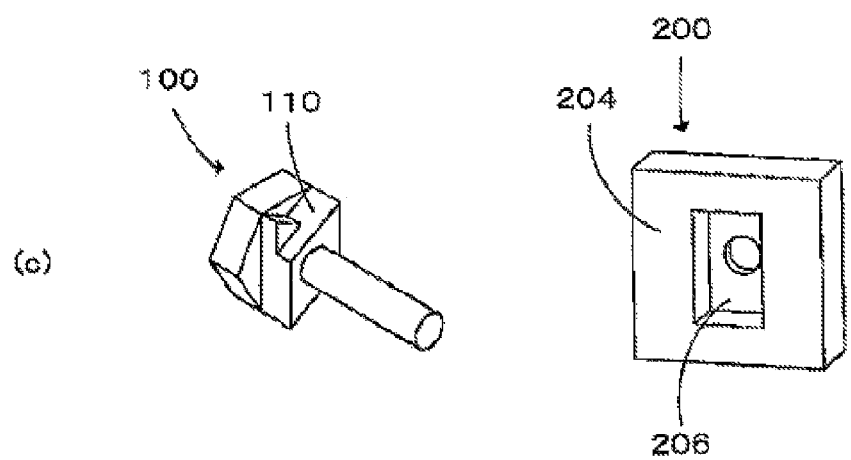

While in the embodiments of FIGS. 2 to 10 the male member 100 and the female member 200 are configured so that the height of the male member 100 with respect to the female member 200 can be changed by the two arrangements, the male member can be fixed to the female member at different heights not only by the two arrangements but also by a larger number of arrangements. For example, FIG. 11 shows some structures which allow the male member to be fixed to the female member at different heights by engaging the male member and the female member with each other in multiple arrangements. FIG. 11(*a*) shows a structure, in which the recessed part 206 of the female member 200 is provided with a stair-like step portion formed at a different depth therefrom, thereby allowing the protruding part 110 of the male member 100 to be engaged with the female member 200 at the step having a different height according to a mounting angle of the male member 100 to the female member 200. FIG. 11(*b*) shows, as with FIG. 11(*a*), a structure which allows the protruding part 110 of the male member 100 to be engaged with a step portion formed at a different depth in the recessed part 206 of the female member 200. FIG. 11(*c*) shows a structure, in which the protruding part 110 of the male member 100 is provided with multiple step portions having different heights, thereby allowing the different step portions of the protruding part 110 of the male member 100 to make contact with the first surface 204 of the female member 200 by changing the engagement position according to the mounting angle of the male member 100 to the female member 200.

CROSS REFERENCE TO RELATED APPLICATION

This application is based on and claims priority from Japanese Patent Application No. 2012-121515 filed on May 29, 2012.

EXPLANATION OF REFERENCE NUMERALS

10 conveying mechanism
12 wafer
14, 16, 18, 20 chucking unit
14*a*, 16*a*, 18*a*, 20*a* arm
14*b*, 16*b*, 18*b*, 20*b* arm
14*c*, 16*c*, 18*c*, 20*c* chuck piece
14*d*, 16*d*, 18*d*, 20*a* connecting member
22 air cylinder
24 air cylinder
25 main frame
26, 28, 30 rigid rod
50 stopper device
100 male member
200 female member
102 screw part
104 head part
106 stopper surface
108 first surface
110 protruding part
112 second surface
202 hole
204 first surface
206 recessed part
208 second surface
300 nut

What is claimed is:

1. A workpiece conveying device for conveying a workpiece, comprising:
   a workpiece holding mechanism configured to operate so as to hold and release the workpiece;
   an actuator equipped with a movable member directly or indirectly connected to the workpiece holding mechanism in order to drive the workpiece holding mechanism over a movable range; and
   a stopper device having a male member and a female member, at least one of the male member and the female member having a stopper surface, the stopper surface limiting the movable range of the workpiece holding mechanism when the stopper surface contacts with the workpiece holding mechanism,
   wherein the male member and the female member are configured to engage with each other in at least a first arrangement and a second arrangement,
   wherein in the first arrangement, the stopper surface limits the movable range of the workpiece holding mechanism to a first end position such that when the workpiece holding mechanism is moved to the first end position and contacts the stopper surface, the workpiece holding mechanism is in a first predefined discontinuous holding position, and
   wherein in the second arrangement, the stopper surface limits the movable range of the workpiece holding mechanism to a second end position that is different from the first end position such that when the workpiece holding mechanism is moved to the second end position and contacts the stopper surface, the workpiece holding mechanism is in a second predefined discontinuous holding position.

2. The workpiece conveying device according to claim 1, wherein
   the male member has a protruding part, the female member has a recessed part formed to receive the protruding part of the male member, and the male member and the female member can engage with each other in an arrangement where the protruding part of the male member is received by the recessed part of the female member, and in an arrangement where the protruding part of the male member is not received by the recessed part of the female member, thereby defining at least two predefined discontinuous holding positions of the workpiece holding mechanism connected to the movable member of the actuator.

3. The workpiece conveying device according to claim 1, wherein
   the actuator has a fluid cylinder and a shaft, one end of the shaft is connected to the cylinder, the other end of the shaft is directly or indirectly connected to the workpiece holding mechanism, and the shaft is driven by fluid pressure inside the cylinder.

4. The workpiece conveying device according to claim 1, wherein
   the workpiece is a semiconductor wafer.

5. The workpiece conveying device according to claim 1, wherein the male member and the female member engage with each other in the at least two different arrangements to define at least two different limits for the movable range of the workpiece holding mechanism.

6. The workpiece conveying device according to claim 1, wherein in the first arrangement the male member has a first orientation with respect to the female member, further wherein in the second arrangement the male member has a second orientation that is turned relative to the first orientation.

7. The workpiece conveying device according to claim 1, wherein
the workpiece holding mechanism has at least a pair of arms configured to be able to open and close to hold the workpiece.

8. The workpiece conveying device according to claim 7, wherein
the at least a pair of arms has at least one piece configured to hold the workpiece.

9. A workpiece conveying device for conveying a workpiece, comprising:
a workpiece holding mechanism configured to operate so as to hold and release the workpiece;
an actuator equipped with a movable member directly or indirectly connected to the workpiece holding mechanism in order to drive the workpiece holding mechanism; and
a stopper device having a male member and a female member,
wherein the male member and the female member engage with each other in at least two different arrangements, thereby defining at least two predefined discontinuous holding positions of the workpiece holding mechanism connected to the movable member, and
wherein one of the male member and the female member has a bolt with a screw, and the male member and the female member are configured to be fixed with each other in at least two different arrangements by a nut engaging with the bolt with the screw.

10. The workpiece conveying device according to claim 9, wherein
the workpiece holding mechanism has at least a pair of arms configured to be able to open and close to hold the workpiece.

11. The workpiece conveying device according to claim 10, wherein
the at least a pair of arms has at least one piece configured to hold the workpiece.

12. A stopper device for a workpiece holding mechanism, comprising:
a male member; and
a female member;
at least one of the male member and the female member having at least first and second parallel surfaces located away from each other with respect to a normal direction of the first and second parallel surfaces, the other of the male member and female member having a contact surface, and
at least one of the male member and the female member having a stopper surface defining an end position of a movable range of the workpiece holding mechanism,
wherein the male member and the female member are configured to be engaged with each other in at least first and second different arrangements,
wherein in the first arrangement the contact surface contacts with the first parallel surface but not the second parallel surface to define a first predefined discontinuous holding position configured for limiting a movable range of the workpiece holding mechanism,
wherein in the second arrangement the contact surface contacts with the second parallel surface to define a second predefined discontinuous holding position configured for limiting a movable range of the workpiece holding mechanism.

13. The stopper device according to claim 12, wherein
the male member has a protruding part, the female member has a recessed part formed to receive the protruding part of the male member, and the male member and the female member can engage with each other in an arrangement where the protruding part of the male member is received by the recessed part of the female member, and in an arrangement where the protruding part of the male member is not received by the recessed part of the female member, thereby defining at least two predefined discontinuous holding positions of the workpiece holding mechanism.

14. The stopper device according to claim 12, wherein the male member and the female member engage with each other in the at least two different arrangements to define at least two different limits for the movable range of the workpiece holding mechanism.

15. A stopper device for a workpiece mechanism, comprising:
a male member; and
a female member;
wherein the male member and the female member are configured to be engaged with each other in at least two different arrangements, thereby defining at least two predefined discontinuous holding positions of the workpiece holding mechanism, and wherein
one of the male member and the female member has a bolt with a screw, and the male member and the female member are configured to be fixed with each other in at least two different arrangements by a nut engaging with the bolt with the screw.

16. The stopper device according to claim 15, wherein
the male member has a protruding part, the female member has a recessed part formed to receive the protruding part of the male member, and the male member and the female member can engage with each other in an arrangement where the protruding part of the male member is received by the recessed part of the female member, and in an arrangement where the protruding part of the male member is not received by the recessed part of the female member, thereby defining at least two predefined discontinuous holding positions of the workpiece holding mechanism.

17. A method for adjusting a holding position of a workpiece holding mechanism by means of a stopper device, the stopper device having a male member and a female member, at least one of the male member and the female member having at least first and second parallel surfaces located away from each other with respect to a normal direction of the first and second parallel surfaces, the other of the male member and female member having a contact surface, and at least one of the male member and the female member having a stopper surface defining an end position of a movable range of the workpiece holding mechanism, the method comprising:
changing a relative engagement position of the male member and the female member of the stopper device from a first arrangement to a second arrangement;
wherein in the first arrangement the contact surface contacts with the first parallel surface but not the second parallel surface to define a first predefined discontinuous holding position configured for limiting a movable range of the workpiece holding mechanism, and wherein in the second arrangement the contact surface contacts with the second parallel surface to define a second predefined discontinuous holding position configured for limiting a movable range of the workpiece holding mechanism.

18. The method according to claim 17, wherein one of the male member and the female member has a bolt with a screw, and the male member and the female member are configured to be fixed with each other in at least two different arrangements by a nut engaging with the bolt with the screw, the method comprising:

loosening the nut; and fastening the nut to fix the male member and the female member at a changed engagement position.

19. The method according to claim 17, wherein the male member and the female member are configured to engage with each other in the at least two different arrangements to define at least two different limits for the movable range of the workpiece holding mechanism.

20. The method according to claim 17, wherein the step of changing the relative engagement position comprises turning the male member relative to the second member to selectively engage the male member with the female member in each of the at least two different arrangements.

* * * * *